United States Patent [19]

Sakamoto et al.

[11] Patent Number: 4,725,345
[45] Date of Patent: Feb. 16, 1988

[54] METHOD FOR FORMING A HARD CARBON THIN FILM ON ARTICLE AND APPLICATIONS THEREOF

[75] Inventors: Masakatsu Sakamoto; Shuhei Ohta; Shiro Iwakura; Kaoru Yamazaki; Yoichi Yaguchi; Hiroaki Toshima; Tsugio Sato, all of Tokyo, Japan

[73] Assignee: Kabushiki Kaisha Kenwood, Japan

[21] Appl. No.: 853,182

[22] Filed: Apr. 17, 1986

[30] Foreign Application Priority Data

| Apr. 22, 1985 | [JP] | Japan | 60-84529 |
| Apr. 22, 1985 | [JP] | Japan | 60-84530 |
| Apr. 22, 1985 | [JP] | Japan | 60-84531 |
| Jun. 12, 1985 | [JP] | Japan | 60-127690 |
| Sep. 9, 1985 | [JP] | Japan | 60-197760 |

[51] Int. Cl.$^4$ ............................ C23C 14/00
[52] U.S. Cl. .................. 204/192.31; 204/192.11; 204/192.15; 427/38; 427/39; 427/41; 428/408
[58] Field of Search ........ 204/192.31, 192.11, 204/192.15; 428/408; 427/38, 39, 41

[56] References Cited

U.S. PATENT DOCUMENTS

| 4,173,522 | 11/1979 | Pulker et al. | 204/192.11 |
| 4,460,060 | 7/1984 | Hasumi et al. | 428/408 |
| 4,470,479 | 9/1984 | Inoue et al. | 204/192.15 |
| 4,486,286 | 12/1984 | Lewin et al. | 204/192.11 |
| 4,490,229 | 12/1984 | Mirtich et al. | 204/192.11 |
| 4,525,417 | 6/1985 | Dimigen et al. | 204/192.15 |
| 4,551,216 | 11/1985 | Argyo | 204/192.15 |
| 4,552,243 | 11/1985 | Melillo et al. | 428/408 |

OTHER PUBLICATIONS

Banks et al., Jvac Sci. Technol. 21(3), 1982, pp. 807–814.

Primary Examiner—Arthur P. Demers
Attorney, Agent, or Firm—Gerald J. Ferguson, Jr.; Michael P. Hoffman; Michael J. Foycik, Jr.

[57] ABSTRACT

A method of forming diamond-like carbon layer which is advantageously adaptable as a coating layer on acoustic diaphragms. In the method, carbon vaporized out of solid carbon source is deposited onto the surface of the diaphragm as the coating layer in the atmosphere of catalytic gas, for instance, $H_2+Ar$ or $H_2$ of about $10^{-4}$ Torr. The deposited carbon layer on the surface of the diaphragm is an amorphous carbon of inclusion of hybridized orbital $SP^2$ bond and hybridized orbital $SP^3$ bond and crystalline carbon particles of hybridized orbital $SP^3$ bond dispersed in the amorphous carbon, or an amorphous carbon of inclusion of hybridized orbital $SP^2$ bond and hybridized orbital $SP^3$ bond.

15 Claims, 11 Drawing Figures

METHOD FOR FORMING A HARD CARBON THIN FILM ON ARTICLE AND APPLICATIONS THEREOF

FIELD OF THE INVENTION AND RELATED ART

The present invention relates to a method for forming a hard carbon thin film or layer at a low pressure and at relatively low temperatures and applications thereof.

A chemical vapor deposition process (plasma CVD) and an ionization deposition process are known as methods of manufacturing a thin diamond film or layer, which has attracted an attention as a new material in recent years, at a low pressure and at relatively low temperatures. It has been confirmed that diamond was formed by these processes. Further, the process using microwave discharge as a plasma generating method has also recently been proposed (Japanese patent unexamined publication No. 110494/1983).

According to those forming processes, hydrocarbon and hydrogen gas are used as a mixture gas, this mixture gas is discharged onto the surface of the heated substrate, and thereby educing diamond from the vapor through decomposition of hydrocarbon. The acoustic diaphragm consisting of a diamond like carbon layer has been proposed as the applied technology. There have been proposed the acoustic diaphragm in which the solid carbon source was formed due to an ion beam deposition process (Japanese patent examined publication No. 33237/1980) and the acoustic diaphragm which was formed by an amorphous carbon eduction layer containing hydrogen due to thermal decomposition of hydrocarbon (Japanese patent unexamined publication No. 162194/1983).

However, diamond produced by those methods has the drawback such that the deposition rate is low. It is considered that this is because since it is a fundamental idea to decompose the hydrocarbon gas such as methane or the like, a vacuum degree decreases and the mean free path is reduced. In addition, although the sonic velocity, Young's modulus, and rigidity of the acoustic diaphragm proposed hitherto can be certainly improved, there is the drawback such that the peak of high frequency resonance occurs in the case of assembling such acoustic diaphragms to a speaker unit. It is considered that this is because since only diamond is formed, in spite of the improvement of the physical characteristic, a moderate internal loss of the diaphragm itself is not obtained.

OBJECT AND SUMMARY OF THE INVENTION

It is an object of the present invention to provide a method for forming a hard carbon layer in which the forming speed is improved.

Another object of the invention is to provide a method for forming a hard carbon layer which is suitable to cover the surface of an acoustic diaphragm.

Still another object of the invention is to provide an acoustic diaphragm having a good high frequency characteristic.

A method according to the present invention belongs to what is called an ion plating process and relates to a method whereby carbon is heated and evaporated in the vacuum by an electron beam or the like and thereby depositing a hard carbon thin layer on the substrate. In this method, by use of graphite as a solid carbon source, the carbon vapor is ionized in the relatively high vacuum in the order of $10^{-4}$ Torr by an ionizing electrode (probe) and a filament or by an ionizing electrode (probe). Further, catalystic gas such as the mixture gas of hydrogen and argon is added. In this way, the deposited carbon layer is predominantly amorphous carbon of inclusion of hybridized orbital $SP^2$ bond and hybridized orbital $SP^3$ bond and crystalline carbon particles of hybridized orbital $SP^3$ bond dispersed in said amorphous carbon, or an amorphous carbon of inclusion of hybridized orbital $SP^2$ bond and hybridized orbital $SP^3$ bond. When the deposition rate is smaller than 0.02 $\mu$m/min, the effect of improvement of the high frequency characteristic cannot be obtained. On one hand, when the deposition rate exceeds 0.1 $\mu$m/min, adhesive property with the diaphragm substrate deteriorates. Therefore, it is desirable to set the deposition rate to a value within a range of 0.02 to 0.1 $\mu$m/min.

Since diamond and graphite are the allotrope of carbon, the produced layer was analyzed and their crystalline properties were compared through the electron diffraction. Thus, it has been found that the crystal in the layer formed due to the ion plating process according to the invention coincides with the spacing of diamond. Also, the layer in which amorphous carbon mixedly exists was obtained. The existence of diamond was confirmed by the respective measuring methods such as infrared spectrum, photo-electron spectrum, hardness measurement, and the like.

| | PLANE-SPACING | | |
|---|---|---|---|
| Diamond (ASTM-675) | | A hard carbon layer formed by the invention | |
| hkl | Plane-spacing (Å) | Plane-spacing (Å) | Difference of plane-spacing (%) |
| 111 | 2.06 | 2.06 | 0 |
| 220 | 1.261 | 1.21 | 4.04 |
| 311 | 1.0754 | — | — |
| 400 | 0.8916 | — | — |
| 331 | 0.8182 | 0.807 | 1.37 |

Advantages of the method for forming a hard carbon layer according to the present invention will be summarized as follows.

1. Since the hard carbon layer can be formed on the substrate at a low pressure and at ordinary temperatures and the thin metal layer made of aluminum or titanium of tens of microns is used as the substrate of the diaphragm, no thermal deformation occurs (at temperatures below 500° C.) and no stress is applied to the whole diaphragm.

2. Since the adhesive property of the hard carbon layer with the substrate is good and stable, the produced layer of the diaphragm is hardly peeled off and variations in Young's modulus, density, internal loss, and the like are small.

3. Since the deposition rate of the hard carbon layer is triple as high as that by the ion beam process, an excellent mass productivity is obtained.

4. Since the hard carbon layer is formed in a wide region, a number of diaphragms can be produced by a single deposition. Thus, an excellent mass productivity is obtained. The diaphragm forming region in this case is 6.5 times as wide as that by the ion beam process.

5. Since the evaporated particles are widely dispersed and the layer is uniformly deposited onto the diaphragm and the thickness of layer can precisely controlled, an excellent mass productivity is derived.

According to the method for forming the hard carbon layer of the invention, the material and shape of the substrate, and the like are not limited, so that the following wide applications can be considered.

1. The rigidity, hardness and abrasion resistance are high. Therefore, the following applications can be mentioned.

Acoustic field—Improvement of the rigidity of the diaphragm, tone arm, or cantilever.

Electronic field—Improvement of the abrasion resistance of the magnetic heads (to record and reproduce the audio signal, video signal, or data signal on and from the recording medium such as magnetic disk, optical disk, magnetic tape, or floppy disk).

Mechanical field—Improvement of the hardness of various kinds of bearings, cutting tools (bites), cutters, etc.

2. The weatherability is excellent. Therefore, the following applications can be mentioned.

Optical field—Protection of the lens.

Overall field—Improvement of the corrosion resistance of the precision parts and external appearance decoration parts.

3. The transmission factor of the infrared rays is excellent. Therefore, the following applications can be mentioned.

Optical field—Applications to the infrared transmissive window and nonreflective parts.

4. The electrical insulation property and thermal conductivity are excellent and the thermal expansion coefficient is low. Therefore, the following applications can be mentioned.

Electric and electronic fields—Improvement of the heat radiation property and insulation of various kinds of heat sinks. Applications to the electronic parts such as semiconductors and the like.

Particularly, as a typical application of the hard carbon layer which is formed by the method according to the invention, this hard carbon layer is suitable as a coating layer onto the surface of the diaphragm of the speaker. The quality of the sound which is reproduced by the speaker largely depends on the performance (physical properties) of this diaphragm. It is necessary to satisfy the following conditions as the diaphragm of the speaker. Namely, the light, strong and weak resonance diaphragm is desirable. In terms of the physical properties, it is preferable to use the material having the characteristics of low density, high elasticity, and large internal loss.

Diamond has the highest hardness and ridigity on earth and has the excellent physical properties with regard to the Young's modulus, sonic velocity, and the like as compared with the other materials. Therefore, diamond is a favorable diaphragm material. When considering the diaphragm of the speaker, even if layer-like diamond could be formed due to the process at ordinary temperatures and at a low pressure, the single diamond body itself would have been broken due to the impact from the outside or the internal stress. Thus, it is difficult to manufacture the speaker diaphragms made of diamond. In terms of the sound quality and performance, there are also problems such that the resonance of the diaphragm occurs because of its high rigidity, and the like.

However, the hard carbon layer formed due to the ion plating process according to the present invention has the feature such that the diamond particles having the $SP^3$ bond were dispersed in the carbon layer mainly having the hybridized orbital $SP^2$ bond. Therefore, the specific note at the resonance frequency is suppressed and the generation of unnecessary noise is little and also the rigidity is high. Further, this hard carbon layer can eliminate what is called a "brittleness" such that the layer is broken due to the impact from the outside or the internal stress. Consequently, the diaphragm having the acoustically ideal performance could be formed. The following table shows the comparison of the mechanical characteristics between titanium and the hard carbon layer formed by the invention.

|  | Young's modulus dyne/cm$^2$ | Propagation velocity m/sec | Specific modules of elasticity cm$^2$/sec$^2$ | Internal loss tan δ |
| --- | --- | --- | --- | --- |
| Titanium | $1.1 \times 10^{12}$ | 4,948 | $25 \times 10^{10}$ | 0.014 |
| Hard carbon layer formed by the invention | $3.1 \times 10^{12}$ | 8,350 | $70 \times 10^{10}$ | 0.026 |

DETAILED DESCRIPTION OF THE PREFERRED EMBODIMENTS

Figure 1:
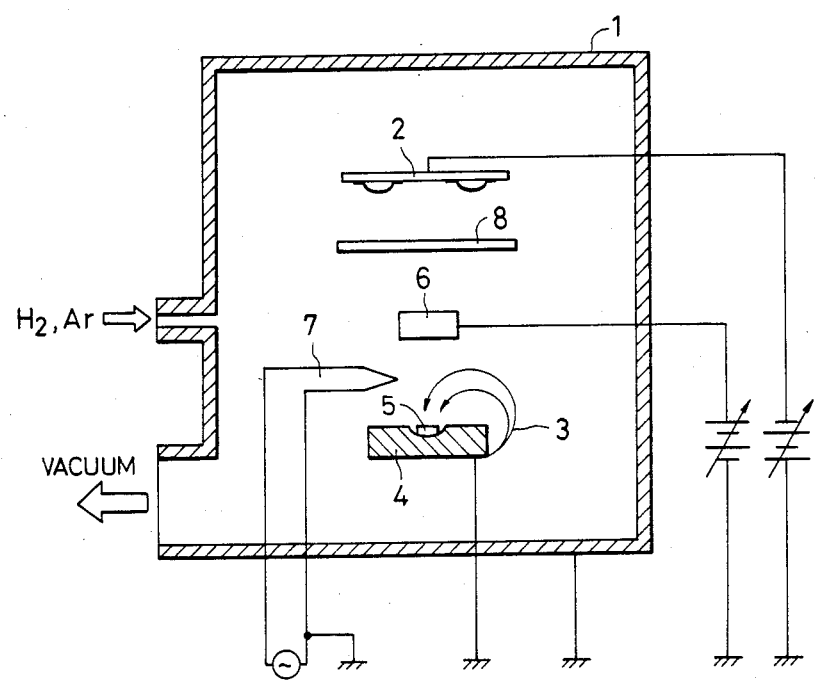
FIG. 1 is a diagram showing an apparatus to embody a method for forming a hard carbon layer according to the present invention.

A method for forming a hard carbon layer according to the present invention is accomplished by an apparatus shown in FIG. 1.

An article 2 as substrate which is formed with a hard carbon layer on the surface is disposed in a vacuum chamber 1 and the air is exhausted from this chamber to the vacuum pressure of the order of $10^{-6}$ Torr. Thereafter, the argon gas or the mixture gas of hydrogen and argon is introduced into the vacuum chamber 1 so that the gas pressure in the vacuum chamber becomes the order of $10^{-4}$ Torr Graphite 5 in a crucible 4 is evaporated by applying an electron beam 3 onto the graphite 5. At the same time, a DC voltage of 50 V is applied to an ionizing electrode 6 arranged over the crucible 4. In addition, a current of a predetermined amount is also supplied to an electron emitting filament 7 disposed between the crucible 4 and the ionizing electrode 6. The evaporated carbon is ionized in the electric field produced by electrode 6 and becomes a plasma state with the mixture gas.

A DC voltage in a range of $-100$ to $-1$ kV is applied to the article 2 and a shutter 8 is opened to form a layer onto the article 2 serving as a base material. It is desirable to set the deposition rate to a value within a range of 0.02 to 0.1 μm/min. The layer on the article 2 formed in this manner was evaluated. The hardness of Hv 3000 to 4000 was obtained and it has been confirmed through electron diffraction and ESCA spectrum that the $SP^3$ diamond bond was formed. On the other hand, no hydrogen was detected in the layer.

In the above process, the preparation like cleaning on the surface of the article 2 is conducted before the evaporating step of the graphite. After arranging the article 2 and evacuating the chamber 1, Argon gas or mixture gas of Argon and hydrogen of the order of $10^{-2}$ Torr is introduced into the chamber 1. DC voltage of several hundred voltages is applied onto the article 2 to bombard the surface of the article 2 with ionized argon. This preparation is useful for better deposition characteristics of carbon on the surface of the article 2. After the ion bombard as preparation, the argon gas is drained from the chamber 1.

According to the method of the invention, it has been found that the hard carbon layer consisting of amorphous carbon of inclusion of hybridized orbital $SP^2$ bond and hybridized orbital $SP^3$ bond and crystal grains or particles of the hybridized orbital $SP^3$ bond dispersed in the amorphous carbon, or the hard carbon layer of amorphous carbon of the $SP^2$ bond and $SP^3$ bond.

According to this method, since graphite as a solid carbon source is used, it can be ionized in a relatively high vacuum condition in the order of $10^{-4}$ Torr and the layer can be manufactured in the atmosphere added with hydrogen. Therefore, the deposition rate can be improved and the particles having the $SP^3$ bond can be dispersed in the carbon layer mainly having the $SP^2$ bond. Thus, a moderate internal loss can be presented to the layer. In the case of applying the hard carbon layer formed by the invention to the diaphragm of the speaker, the occurrence of the high frequency resonance could be prevented.

Application 1

Figure 2:
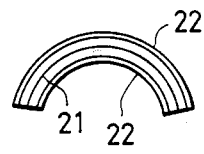
FIGS. 2 to 6 are diagrams showing dome-shaped diaphragms each of which was coated with a hard carbon layer on the surface.

A base material 21 of a dome-shaped acoustic diaphragm made of titanium having the thickness of 20 μm as shown in FIG. 2 is disposed in the vaccum chamber and the inside pressure is reduced to $10^{-6}$ Torr. Thereafter, as preparation step, ions are irradiated by applying a DC voltage of hundreds of volts in the mixture gas atmosphere of $Ar+H_2$ at the pressure of $10^{-2}$ Torr. And the aforementioned ion plating process is conducted.

In the case of this ion plating process, at the vacuum degree of $10^{-4}$ Torr (mixture gas of $Ar+H_2$), the evaporation rate of graphite was 0.25 g/min and the deposition rate of the hard carbon layer was 0.02 μm/min.

A hard carbon layer 22 obtained by this ion plating method was analyzed by the electron diffraction or ESCA method. Thus, it has been confirmed that the fine crystalline grains (crystalline particles of the diamond structure) of the $SP^3$ bond were dispersed in the amorphous layer of the hybridized orbital $SP^2$ bond and hybridized orbital $SP^3$ bond, or that an amorphous carbon of the $SP^2$ bond and $SP^3$ bond was formed.

The sonic velocity of the whole diaphragm formed with the hard carbon layer of 0.3 μm was within a range of 9,000 to 12,000 m/sec.

Application 2

Figure 3:
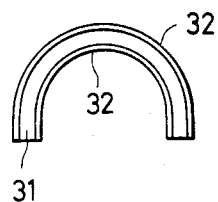
Figure 4:
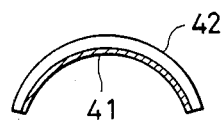

As shown in FIG. 3, hard carbon layers 32 each having the thickness of 0.3 μm are formed onto both surfaces of an acoustic diaphragm base material 31 made of titanium of the thickness of 20 μm which is constituted by integrally forming a voice coil bobbin portion and a dome portion. A voice coil is wound around the voice coil bobbin portion of the integrated type diaphragm. The characteristics of the tweeter unit having a free edge were measured. Thus, it has been found that the high frequency characteristic was improved, namely, the reproducible limit frequency in the high frequency range was extended. The reproduced sound with less distortion until a super high frequency could be obtained.

Application 3

A hard carbon layer 42 is formed by way of the ion plating process onto a base material 41 of a dome-shaped β type SiC ceramic diaphragm obtained due to the CVD process. In this process, the β type SiC diaphragm base material 41 is disposed in the vacuum chamber and the inside pressure is reduced to $10^{-6}$ Torr. Thereafter, as preparation step, ions are irradiated in the mixture gas atmosphere of $Ar+H_2$ at the vacuum pressure of $10^{-2}$ Torr by applying the DC voltage of hundreds of volts.

In the case of this ion plating process, at the vacuum degree of $10^{-4}$ Torr (with the mixture gas of $Ar+H_2$), the evaporation rate of graphite was 0.25 g/min and the deposition rate of the hard carbon layer was 0.02 μm/min.

The hard carbon layer obtained by the ion plating process was analyzed by the electron diffraction or ESCA method. Thus, it has been found that the fine crystalline grains of the $SP^3$ bond (crystalline particles of the diamond structure) were included in the amorphous carbon layer of the hybridized orbital $SP^2$ bond and hybridized orbital $SP^3$ bond. This layer is extremely hard and can be used as a surface layer of the diaphragm.

According to this ion plating process, on one hand, the ion deposition rate was 200 Å/min and extremely high, so that an excellent mass productivity is obtained. As the ceramic diaphragm base material, TiC, $B_4C$, and the like are useful.

Application 4

Figure 5:
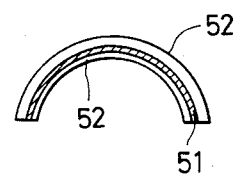

As shown in FIG. 5, hard carbon layers 52 are formed onto both surfaces of a diaphragm base material 51. The characteristics of this layer were measured. Thus, it has been found that the young's modulus and sonic velocity were further improved.

The diaphragm obtained in the application 4 or 5 was assembled to a tweeter unit and its frequency characteristics were measured. Thus, it has been found that the reproducible high frequency range was extended, the flat frequency response was obtained, and the harmonic distortion was reduced.

Application 5

Figure 6:
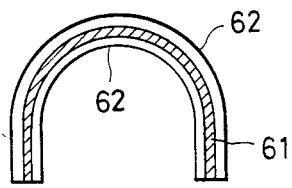

As shown in FIG. 6, hard carbon layers 62 are formed onto both surfaces of a β type SiC ceramic diaphragm base material 61 in which a voice coil bobbin portion and a dome portion are integrally formed. A voice coil is wound around the voice coil bobbin portion of this integrated type diaphragm and a tweeter unit is constituted. The characteristics of this tweeter unit were measured. Thus, it has been found that the reproducible limit frequency in the high frequency range was further extended and the reproduced sound with less distortion until a super high frequency was derived.

Application 6

Figure 7:
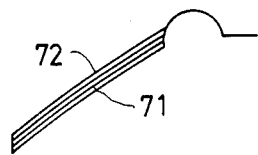
FIGS. 7 to 9 are diagrams showing cone-shaped diaphragms each of which was coated with a hard carbon layer on the surface.

As shown in FIG. 7, an FRP (fiber reinforced plastic) diaphragm is used as a base material which is formed with a hard carbon layer. The FRP diaphragm base material is obtained by using PEEK (polyether ether ketone) as a matrix resin and an SiC inorganic fiber as a heat-resisting reinforced fiber. Such an FRP diaphragm base material 71 can be easily produced due to a molding process such as heating press, injection, compression, or the like. The heat-resisting temperature of the diaphragm base material 71 was about 350° C.

A hard carbon layer 72 of 0.3 μm is formed onto the FRP diaphragm base material 71 due to the ion plating process.

In this ion plating process, the FRP diaphragm base material 71 is disposed in the vacuum chamber and the inside pressure is reduced to $10^{-6}$ Torr Thereafter, ions are irradiated in the mixture gas atmosphere of $Ar+H_2$ at the pressure of $10^{-2}$ Torr by applying the DC voltage of hundreds of volts. In the case of this ion plating process, at the vacuum degree of $10^{-4}$ Torr (with the mixture gas of $Ar+H_2$), the evaporation rate of graphite was 0.25 g/min and the deposition rate of the hard carbon layer was 0.02 μm/min. The temperature in the vacuum chamber was within a range of room temperature to about 250° C.; therefore, the FRP diaphragm base material serving as the material to be coated could sufficiently endure this temperature.

The hard carbon layer obtained by this ion plating process was analyzed due to the electron diffraction or ESCA method. Thus, it has been found that the fine crystal grains of the $SP^3$ bond (crystal particles of the diamond structure) were included in the amorphous carbon layer in which the hybridized orbital $SP^2$ bond and hybridized orbital $SP^3$ bond mixedly existed.

As the result of the measurement, it has been found that the sonic velocity of the whole diaphragm was within a range of 5,000 to 6,000 m/sec and was further improved as compared with the sonic velocity of 3,500 m/sec of the diaphragm formed of only FRP.

A polyimide resin or the like may be used as the heat-resisting resin. An $Al_2O_3$ (alumina) fiber or the like may be used as the heat-resisting fiber.

Application 7

A hard carbon layer is formed onto an FRM (fiber reinforced metal) diaphragm base material due to a hot press process using aluminium or aluminium alloy as the matrix and SiC as the heat-resisting reinforced fiber. The propagation velocity of this FRM diaphragm base material itself was within a range of 6,000 to 6,500 m/sec.

Figure 8:
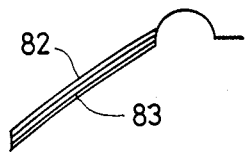

As shown in FIG. 8, a hard carbon layer 82 is formed onto the surface of such an FRM diaphragm base material 83 in a manner similar to the application 6. In this case, the propagation velocity of the whole diaphragm was within a range of 8,000 to 9,000 m/sec and the propagation velocity was remarkably improved.

Application 8

Figure 9:
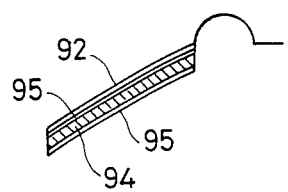

As shown in FIG. 9, an FRM multi-layer diaphragm base material using a metal aluminium or aluminium alloy honeycomb 94 as a core material and having Al/SiC layers 95 on both front and back surfaces is obtained. A hard carbon layer 92 is formed on the surface of this base material in a manner similar to the application 6. In this case as well, the Young's modulus and sonic velocity of the whole diaphragm were also remarkably improved.

Figure 10:
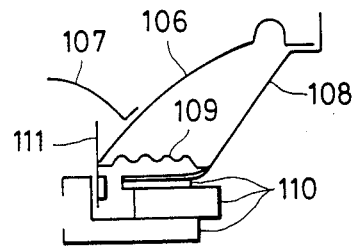
FIG. 10 is a diagram showing a structure of a speaker including a composite diaphragm shown in each of FIGS. 7 to 9.

FIG. 10 is a cross sectional view showing the state in which a diaphragm 106 obtained by application 6 was assembled in a speaker unit. In the diagram, reference numerals 107 denotes a cap; 108 is a frame; 109 a damping spider; 110 a magnetic circuit; and 111 a voice coil. The characteristics of the speaker unit constituted as described above were measured. Thus, it has been found that the reproducible high frequency range was extended, the flat frequency response was obtained, and the harmonic distortion was reduced.

According to the acoustic composite diaphragms of the applications 6 to 7, the diaphragm base material consisting of the heat-resisting resin and heat-resisting reinforced fiber or consisting of the metal and heat-resisting reinforced fiber is obtained, or the composite diaphragm base material of such a diaphragm base material is obtained; then the hard carbon layer consisting of the amorphous layer in which the hybridized orbital $SP^2$ bond and hybridized orbital $SP^3$ bond mixedly exist and the crystal particles of the hybridized orbital $SP^3$ bond, or the amorphous hard carbon layer in which the above $SP^2$ bond and $SP^3$ bond mixedly exist is formed onto at least one of both front and back surfaces of the foregoing diaphragm base material or composite diaphragm base material due to the ion plating process. Therefore, the acoustic characteristics of the whole diaphragm, particularly, the sonic velocity, Young's modulus, rigidity, etc. are improved. The reproducible high frequency range is extended and flattened. The harmonic distortion can be reduced. On one hand, the hard carbon layer is formed due to the ion plating process, so that the ion deposition rate is high and the method of this invention is very economical and has an extremely high industrial advantage as compared with the other process.

Application 9

Figure 11:
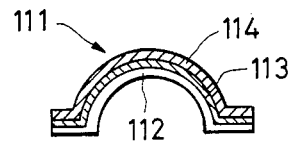
FIG. 11 is a diagram showing dome-shaped diaphragms each of which was formed with an intermediate layer between a base material of a diaphragm and a hard carbon layer.

An acoustic diaphragm of FIG. 11 is obtained in the following manner. Namely, a middle or intermediate thin layer consisting of a single body of titanium compound such as titanium carbide, titanium nitride, or the like, or a mixture body thereof, or silicon carbide, or silicon nitride is formed onto at least one of front and back surfaces of the titanium diaphragm base material by the ion plating process. Further, the hard carbon thin layer is formed on the middle thin layer due to the ion plating process.

A middle thin layer 113 made of titanium carbide is formed on the surface of a titanium diaphragm base material 112 by the ion plating process. In this case, the base material 112 of the thickness of 20 μm is cleaned and the pressure in the vacuum chamber is reduced to $10^{-6}$ Torr. Thereafter, argon ions are irradiated in the argon gas atmosphere (at the pressure of $10^{-2}$ Torr) by applying the DC voltage in a range of hundreds volts to one kilovolt. At this time, intermediate layer material gas of the $CH_4$ gas is introduced into the vacuum chamber at the vacuum degree of $10^{-4}$ Torr and titanium Ti serving as an intermediate layer material solid source is ionized by an electron beam as plasma. Thus, vaporized Ti in the plasma reacts to C produced by decomposing $CH_4$ to produce TiC and this TiC is deposited onto the titanium diaphragm base material 112, so that the intermediate thin layer 113 is formed. The hard carbon thin layer was formed onto the middle thin layer in the following manner.

The carbon source (graphite) in the crucible is evaporated using an electron beam.

The electron emitting filament is arranged over the crucible and the ionizing electrode is disposed over this filament. The DC voltage of 50 V is applied to the ionizing electrode and a predetermined voltage is also applied to the electron emitting filament, thereby ionizing evaporated carbon.

Thereafter, the mixture gas of $H_2+Ar$ is introduced into the vacuum chamber. The carbon layer is formed onto the composite layer consisting of a titanium diaphragm base material 122 and a middle thin layer 113, thereby obtaining a hard carbon thin layer 114 as shown in FIG. 11.

The hard carbon thin layer 114 obtained in this manner was evaluated. Thus, it has been found due to the electron diffraction and ESCA spectrum that the hardness was within a range of HV 3,000 to 4,000 and the diamond particles having the hybridized orbital $SP^3$ bond were dispersed in the carbon layer mainly having the hybridized orbital $SP^2$ bond.

The sonic velocity of a diaphragm 111 obtained as described above was within a range of 12,000 to 13,000 m/sec and the producible high frequency range was extended and the hardness of the surface was increased. On one hand, the internal loss tan $\delta$ was 0.01 or more.

As described above, the middle thin layer is formed on the surface of the titanium diaphragm base material and the hard carbon thin layer in which the diamond particles having the hybridized orbital $SP^3$ bond were dispersed in the carbon layer mainly having the hybridized orbital $SP^2$ bond is formed on the surface of the middle thin layer. Thus, the internal loss can be increased as compared with the acoustic diaphragm previously proposed by the same applicant (Japanese patent unexamined publication No. 84529/1985). Either one of the above-mentioned diaphragms can be selectively used in accordance with the application.

In the applications 10, in addition to titanium carbide (TiC), another titanium compound such as titanium nitride (TiN) or the like may be used as the middle layer. On the other hand, by use of the mixture gas of $CH_4+N_2$ as the discharge gas, the middle thin layer 113 consisting of the mixture material of titanium carbide and titanium nitride can be simultaneously formed. In this case, the physical properties of the resultant mixture material are good.

Further, since silicon carbide (SiC) has the diamond type covalent bond structure, it has a high hardness and is suitable as the middle thin layer.

Boron nitride (BN) and cubic boron nitride (CBN) also have the good physical properties. Particularly, cubic boron nitride has the Knoop hardness of 4700 kg/mm$^2$ and is proper as a material having the excellent hardness.

In the process of forming the hard thin multi-layers, namely, the middle thin layer and the hard carbon thin layer formed thereof due to the ion plating process, by properly selecting the crucible and discharge gas, a desired diaphragm can be obtained in one batch, so that the excellent mass productivity can be obtained. Also, this ion plating process has the features such that the ionizing efficiency is high and the deposition rate is also high, so that it is extremely economical and the reliability is also high since the hard thin layer having the good adhesive property can be obtained.

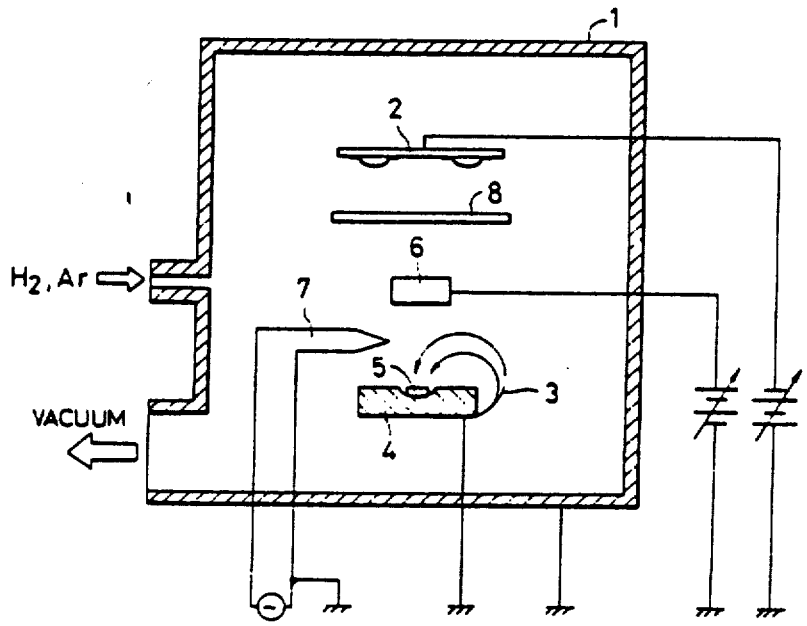

What is claimed is:

1. A method of forming a carbon layer on the surface of an article comprising the steps of:
   respective disposing the article and a solid carbon source at opposite portions in a vacuum chamber which contains catalystic gas of a predetermined pressure wherein said catalystic gas is a hydrogen gas or mixture gas of hydrogen and argon;
   vaporizing the solid carbon and applying an electric field to the vaporized carbon to ionize the vaporized carbon; and
   applying an electrical potential to the article so that the ionized vapor carbon is deposited onto the surface of the article as the carbon layer.

2. A method according to claim 1, wherein said deposited carbon layer is amorphous carbon of inclusion of hybridized orbital $SP^2$ bond and hybridized orbital $SP^3$ bond and crystalline carbon particles of hybridized orbital $SP^3$ bond dispersed in said amorphous carbon.

3. A method according to claim 1, wherein said deposited carbon layer is amorphous carbon of inclusion of hybridized orbital $SP^2$ bond and hybridized orbital $SP^3$ bond.

4. A method according to claim 1, wherein said solid carbon source is graphite.

5. A method according to claim 1, wherein said predetermined pressure is in the order of $10^{-4}$ Torr.

6. A method according to claim 1, wherein the deposition rate of the carbon layer is in the range of 0.02 $\mu$m/min to 0.1 $\mu$m/min.

7. A method of forming a carbon layer and an intermediate layer on the surface of an article comprising the steps of:
   respectively disposing the article, a solid carbon source and an intermediate layer material solid source in a vacuum chamber which contains intermediate layer material gas of a predetermined pressure;
   vaporizing the intermediate layer material solid source and applying an electrical field to the vaporized intermediate layer material solid source to ionize it as plasma which decomposes the intermediate layer material gas, whereby an intermediate layer material compound is produced in the plasma;
   applying an electrical potential to the article so that the intermediate layer material compound is deposited onto the surface of the article as the intermediate layer;
   exhausting the hydrocarbon gas and introducing catalystic gas in the chamber wherein said catalystic gas is hydrogen gas or mixture gas of hydrogen and argon, and vaporizing the solid carbon and applying an electric field to the vaporized carbon to ionize the vaporized carbon; and
   applying an electrical potential to the article so that the ionized vapor carbon is deposited onto the intermediate thin layer on the article as the hard carbon layer.

8. A method according to claim 7, wherein said intermediate layer material gas is hydrocarbon.

9. A method according to claim 8, wherein said hydrocarbon is $CH_4$.

10. A method according to claim 8, wherein said intermediate layer material compound is carbide.

11. A method according to claim 7, wherein the surface of said article is titanium.

12. A method according to claim 7, wherein said intermediate layer material solid source is titanium.

13. A method according to claim 7, wherein said solid carbon source is graphite.

14. A method according to claim 7, wherein said predetermined pressure is in the order of $10^{-4}$ Torr.

15. A method according to claim 7, wherein the deposition rate of the carbon layer is in the range of 0.02 $\mu$m/min to 0.1 $\mu$m/min.

* * * * *

UNITED STATES PATENT AND TRADEMARK OFFICE
CERTIFICATE OF CORRECTION

PATENT NO. : 4,725,345

DATED : February 16, 1988

INVENTOR(S) : Masakatsu SAKAMOTO et al.

It is certified that error appears in the above-identified patent and that said Letters Patent is hereby corrected as shown below:

Kindly substitute the attached Figure for the existing figure on the cover page of the patent.

The Assignee should be changed to read:

(1) Trio Kabushiki Kaisha
Tokyo, Japan and (2) Namiki Precision Jewel Co., Ltd.
Tokyo, Japan Signed and Sealed this Sixth Day of September, 1988

*Attest:*

DONALD J. QUIGG

*Attesting Officer*     *Commissioner of Patents and Trademarks*

United States Patent [19]

Sakamoto et al.

[11] Patent Number: 4,725,345
[45] Date of Patent: Feb. 16, 1988

[54] METHOD FOR FORMING A HARD CARBON THIN FILM ON ARTICLE AND APPLICATIONS THEREOF

[75] Inventors: Masakatsu Sakamoto; Shuhei Ohta; Shiro Iwakura; Kaoru Yamazaki; Yoichi Yaguchi; Hiroaki Toshima; Tsugio Sato, all of Tokyo, Japan

[73] Assignee: Kabushiki Kaisha Kenwood, Japan

[21] Appl. No.: 853,182

[22] Filed: Apr. 17, 1986

[30] Foreign Application Priority Data

| Apr. 22, 1985 | [JP] | Japan | 60-84529 |
| Apr. 22, 1985 | [JP] | Japan | 60-84530 |
| Apr. 22, 1985 | [JP] | Japan | 60-84531 |
| Jun. 12, 1985 | [JP] | Japan | 60-127690 |
| Sep. 9, 1985 | [JP] | Japan | 60-197760 |

[51] Int. Cl.⁴ ............................................. C23C 14/00
[52] U.S. Cl. .......................... 204/192.31; 204/192.11; 204/192.15; 427/38; 427/39; 427/41; 428/408
[58] Field of Search ............ 204/192.31, 192.11, 204/192.15; 428/408; 427/38, 39, 41

[56] References Cited

U.S. PATENT DOCUMENTS

| 4,173,522 | 11/1979 | Pulker et al. | 204/192.11 |
| 4,460,060 | 7/1984 | Hasumi et al. | 428/408 |
| 4,470,479 | 9/1984 | Inoue et al. | 204/192.15 |
| 4,486,286 | 12/1984 | Lewin et al. | 204/192.11 |
| 4,490,229 | 12/1984 | Mirtich et al. | 204/192.11 |
| 4,525,417 | 6/1985 | Dimigen et al. | 204/192.15 |
| 4,551,216 | 11/1985 | Argyo | 204/192.15 |
| 4,552,243 | 11/1985 | Melillo et al. | 428/408 |

OTHER PUBLICATIONS

Banks et al., Jvac Sci. Technol. 21(3), 1982, pp. 807-814.

Primary Examiner—Arthur P. Demers
Attorney, Agent, or Firm—Gerald J. Ferguson, Jr.; Michael P. Hoffman; Michael J. Foycik, Jr.

[57] ABSTRACT

A method of forming diamond-like carbon layer which is advantageously adaptable as a coating layer on acoustic diaphragms. In the method, carbon vaporized out of solid carbon source is deposited onto the surface of the diaphragm as the coating layer in the atmosphere of catalystic gas, for instance, $H_2 + Ar$ or $H_2$ of about $10^{-4}$ Torr. The deposited carbon layer on the surface of the diaphragm is an amorphous carbon of inclusion of hybridized orbital $SP^2$ bond and hybridized orbital $SP^3$ bond and crystalline carbon particles of hybridized orbital $SP^3$ bond dispersed in the amorphous carbon, or an amorphous carbon of inclusion of hybridized orbital $SP^2$ bond and hybridized orbital $SP^3$ bond.

15 Claims, 11 Drawing Figures